US010074608B2

(12) United States Patent
Wilke et al.

(10) Patent No.: US 10,074,608 B2
(45) Date of Patent: Sep. 11, 2018

(54) METHOD FOR MANUFACTURING A CONTACT BUMP BY THERMAL EXPANSION OF A PATTERNED SACRIFICIAL LAYER UNDERNEATH A GALVANIC LAYER

(71) Applicants: Fraunhofer-Gesellschaft zur Förderung der angewandten Forschung e.V., Munich (DE); Technische Universität Berlin, Berlin (DE)

(72) Inventors: Martin Wilke, Berlin (DE); Kai Zoschke, Berlin (DE); Markus Wöhrmann, Berlin (DE); Thomas Fritzsch, Berlin (DE); Hermann Oppermann, Berlin (DE); Oswin Ehrmann, Berlin (DE)

(73) Assignees: Fraunhofer-Gesellschaft zur Förderung der angewandten Forschung e.V., Munich (DE); Technische Universität Berlin, Berlin (DE)

( * ) Notice: Subject to any disclaimer, the term of this patent is extended or adjusted under 35 U.S.C. 154(b) by 0 days.

(21) Appl. No.: 15/399,286

(22) Filed: Jan. 5, 2017

(65) Prior Publication Data

US 2017/0194257 A1    Jul. 6, 2017

(30) Foreign Application Priority Data

Jan. 6, 2016  (DE) .................. 10 2016 200 063

(51) Int. Cl.
*H01L 21/768* (2006.01)
*H01L 23/528* (2006.01)

(52) U.S. Cl.
CPC .... *H01L 23/5283* (2013.01); *H01L 21/76838* (2013.01)

(58) Field of Classification Search
CPC ................. H01L 21/321; H01L 21/288; H01L 21/768–21/76898;
(Continued)

(56) References Cited

U.S. PATENT DOCUMENTS 4,448,636 A     5/1984  Baber
6,300,250 B1 *  10/2001 Tsai ................... H01L 21/2885
                                               257/E21.175

(Continued)

FOREIGN PATENT DOCUMENTS

DE      4032411 A1 *  4/1992  ....... H01L 21/28587
DE      4032411 A1    4/1992
(Continued)

OTHER PUBLICATIONS

Google Patents English Machine Translation of DE4032411.*
(Continued)

*Primary Examiner* — Marc Armand
*Assistant Examiner* — Younes Boulghassoul
(74) *Attorney, Agent, or Firm* — Schwegman Lundberg & Woessner, P.A.

(57) ABSTRACT

A method for manufacturing metal structures for the electrical connection of components comprises the following steps: depositing an auxiliary layer on a substrate; structuring the auxiliary layer in a manner such that the substrate is exposed at least one environment which is envisaged for the metal structures; depositing a galvanic starting layer on the structured auxiliary layer; depositing a lithography layer on the galvanic starting layer and structuring the lithography layer in a manner such that the galvanic starting layer is exposed at least one location envisaged for the metal structure; galvanically depositing the at least one metal structure at the at least one exposed location; removing the structured auxiliary layer. An electronic component is also described.

13 Claims, 6 Drawing Sheets

(58) Field of Classification Search
CPC .......................... H01L 21/441–21/445; H01L 21/0271–21/0273; H01L 24/10–24/17; H01L 23/5283; H01L 23/528; H01L 23/5386
USPC .................................. 257/773, 775; 438/612
See application file for complete search history.

(56) References Cited

U.S. PATENT DOCUMENTS

| | | | | |
|---|---|---|---|---|
| 2005/0164483 | A1* | 7/2005 | Jeong | H01L 24/11 438/612 |
| 2007/0259293 | A1 | 11/2007 | Shin et al. | |
| 2011/0233766 | A1 | 9/2011 | Lin et al. | |

FOREIGN PATENT DOCUMENTS

| | | | | |
|---|---|---|---|---|
| DE | 102008014577 B3 * | 7/2009 | ............. | H01L 24/11 |
| DE | 102008014577 B3 | 7/2009 | | |

OTHER PUBLICATIONS

Google Patents English Machine Translation of DE 102008014577.*
Wayback Machine, "AZ Photoresists" datasheed, https://web.archive.org/web/20151010211846/https://www.microchemicals.com/micro/introduction.pdf, Oct. 10, 2015.*
"German Application Serial No. 10 2016 200 063.2, Examination Report dated Aug. 31, 2016", w/ English Translation, (Aug. 31, 2016), 12 pgs.

\* cited by examiner

METHOD FOR MANUFACTURING A CONTACT BUMP BY THERMAL EXPANSION OF A PATTERNED SACRIFICIAL LAYER UNDERNEATH A GALVANIC LAYER

RELATED APPLICATION

This application claims priority to German Patent Application Number 10 2016 200 063.2, entitled "VERFAHREN ZUR HERSTELLUNG VON METALLSTRUKTUREN UND ELEKTRONISCHES BAUTEIL MIT MINDESTENS EINER METALLSTRUKTUR," filed on Jan. 6, 2016, which is incorporated herein by reference in its entirety.

TECHNICAL FIELD

The subject-matter of the present application includes a method for the manufacture of metal structures for the electrical connection of components, in particular for the manufacture of under-bump metallizations or solder bumps, on (semiconductor) substrates, An electronic component with a substrate with at least one metal structure is also included in the subject-matter of the application.

BACKGROUND

With wafer level packaging, the solder deposition of solder contacts with low dimensions, e.g. with a fine-pitch, for example by way of a controlled collapsed chip connection process, can be created as described hereinafter. A thin galvanic starting layer, a so-called "plating base" is firstly deposited on a wafer or another microelectronic substrate, for example by way of cathode sputtering. A photoresist layer is subsequently deposited onto this and is lithographically structured in a manner such that holes are incorporated into the resist layer, at the locations, at which the solder deposits are to be deposited at a later stage. The holes herein reach down to the galvanic starting layer, so that during the galvanic deposition of the solder or of an under-solder metallization, the solder or the metallization is deposited into the holes of the photoresist, and a fixed connection is created between the galvanic starting layer and the solder deposits. The structured photoresist layer is subsequently removed. Since the galvanic starting layer often extends over a large surface of the substrate, and the different solder bumps could thus become short-circuited, the galvanic starting layer arranged outside the solder bumps is removed for example with the help of a wet-etching method.

SUMMARY

Greater demands are placed on the etching process for removing the galvanic starting layer, in the case of reducing dimensions of the solder contacts or metal structures. An under-etching of the bump contact often occurs with wet-etching. The cause of this is the fact that on etching the galvanic starting layer, the etching agent can also laterally attack the galvanic starting layer, at the end-face of the solder contact, during this etching. A detachment of the solder bumps, e.g. a complete under-etching can occur, in the case of small solder bumps, due to the under-etchings. The present application can provide a method that can ensure a reliable fastening of solder bumps on the substrate, even in the case of small solder bumps.

This can be achieved by a method such as described herein, as well as by a substrate manufactured by way of this method.

The method for manufacturing metal structures for the electrical connection of components can comprise the depositing and structuring of an auxiliary layer on a substrate, the depositing of a galvanic starting layer on the structured auxiliary layer, the subsequent depositing of a lithography layer on the galvanic starting layer and the structuring of the lithography layer, so that the galvanic starting layer is exposed at at least one location envisaged for the metal structure.

The auxiliary layer can be herein selected such that the galvanic starting layer can be sputtered onto the auxiliary layer and for example has a thickness of 50 nm to 20 µm, preferably a thickness between 500 nm and 10 µm. The auxiliary layer can be deposited on the substrate for example by spin-coating, spray-coating or by way of a laminating process or vapor deposition.

The auxiliary layer is preferably deposited onto the substrate in a surfaced (extensive) manner. The auxiliary layer for example can be a plastic-based layer. Herein, water-soluble or also water-insoluble layers are also possible.

The auxiliary layer can be structured after its deposition. Herein, the substrate is exposed at at least one environment which is envisaged for the at least one metal structure. The structuring can be carried out by way of techniques known from the state of the art, such as for example laser ablation, photolithography or plasma processes.

Although the method, on which the application is based, can also be applied when depositing only one metal structure, in numerous embodiment examples one envisages arranging a multitude of metal structures on the substrate. Accordingly, a multitude of environments in the auxiliary layer are exposed in such embodiment examples.

A galvanic starting layer, a so-called plating base, can be deposited on the structured auxiliary layer subsequently to the structuring of this auxiliary layer. Such galvanic starting layers for example can be or consist of titanium (Ti), titanium nitride (TiN), titanium tungsten (TiW), chromium (Cr), nickel (Ni), gold (Au) or copper (Cu), or can comprise one or more of these materials. On later galvanic deposition of the at least one metal structure, the galvanic starting layers form a starting layer which is to simplify the deposition processes. The galvanic starting layers can be sputtered onto the structured auxiliary layer in numerous embodiment examples. In some embodiments, the galvanic starting layer forms a closed layer after deposition. Sections of the galvanic starting layer that occupy the structured auxiliary layer may be connected with sections of the galvanic starting layer that occupy the environments envisaged for the metal structures.

After the deposition the galvanic starting layer, which from now occupies the structured auxiliary layer or the environments envisaged for the metal structures, a lithography layer, for example a photoresist layer is deposited on the galvanic starting layer and subsequently structured. On structuring, at least one location envisaged for the metal structure is exposed. Herein, the exposed location corresponds to the at least one environment which is envisaged for the metal structure and which was incorporated into the auxiliary layer. The location and the corresponding environment can be equally large or differently large, in different embodiments. Thus for example the environment can be larger than the location exposed in the lithography layer. In other embodiments, with regard to its cross-sectional area, the location can be larger than the environment which lies therebelow and which is envisaged for the metal structure.

Holes (e.g. locations) which are used for the galvanic deposition of the at least one metal structure or of the multitude of metal structures, are produced by the structuring of the lithography layer. An under-bump metallization, such as for example nickel, and/or a solder deposit, such as tin-silver for example, for example can be firstly deposited in the at least one exposed location, when galvanically depositing the at least one metal structure. The structured auxiliary layer is removed from the substrate after completing the galvanic deposition, e.g. after completing the metal structure. Herein, the galvanic starting layer which is arranged on the structured auxiliary layer is detached during the removal or before the removal of the structured auxiliary layer. In some embodiments, a section of the galvanic starting layer which occupies the structured auxiliary layer is thereby separated from the section of the galvanic starting layer which occupies the environments.

The galvanic starting layer that lies outside the metal structures can be physically detached by way of detaching this galvanic starting layer arranged on the structured auxiliary layer, for example by way of a high heat input into the auxiliary layer, so that this expands and the galvanic starting layer is quasi blasted away, or by way of dissolving the auxiliary layer (for example by way of deionized water in the case of a water-soluble auxiliary layer). In particular, this means that no further chemical wet-etching of the galvanic starting layer is necessary in numerous embodiments. In particular, this has the advantage that a detachment of the galvanic starting layer below the metal structure by way of an etching method does not occur in the case of small metal structures which have a cross-sectional area (in the context of a standing area which is connected to the galvanic starting layer) of for example less than 400 $\mu m^2$ preferably less than 100 $\mu m^2$, particularly preferably less that 64 $\mu m^2$ or 50 $\mu m^2$. This means that a secure connection between the substrate and the metal structure can also be ensured in the case of small metal structures.

Further embodiments of the method are described hereinafter.

In one embodiment, the substrate is irradiated with light after the galvanic deposition of the at least one metal structure, wherein the intensity and the wavelength of the light are selected such that the structured auxiliary layer expands. For example, on irradiating the auxiliary layer with laser light of for example 248 nm or 308 nm, e.g. in the near UV range and with a suitable flux density for example of between 1 milli-joule and 1 joule per $cm^2$, the auxiliary layer can be heated in such a manner that this abruptly expands and the galvanic starting layer arranged on the structured auxiliary layer almost "blasts away". Since the metal structure has already been deposited at this point in time, and the galvanic starting layer, on which the metal structure is deposited, is not connected to the auxiliary layer but directly to the substrate, the galvanic starting layer connected directly to the substrate is not damaged by the expansion process. However, it is only break-away edges, e.g., traces of breaking which are to be seen at the edge of the remaining galvanic starting layer, but no etching traces, since no wet-chemical etching was applied.

For example, a suitable expansion for blasting away the galvanic starting layer can be determined from the combination between intensity, wavelength and, as the case may be, pulse duration of the light (laser light), as well as the selected material of the auxiliary layer.

In a variant of the radiation of the metal structure with light, the lithography layer is completely removed before the irradiation with light. This simplifies the transfer of heat into the auxiliary layer due to the fact that the heat is not absorbed by the lithography layer. Formulated in a more general manner, in some embodiment examples, the lithography layer is removed before the removal of the auxiliary layer.

In an embodiment, the auxiliary layer is removed by way of a cleaning process. In one variant, the cleaning process can be carried out for example with deionized water, inasmuch as the auxiliary layer is constructed from a water-soluble material. Corresponding cleaning steps can likewise be carried out in the case of other materials which are applied for the auxiliary layer, such as for example with plastics, epoxy resins, polyimides or polybenzoxazoles. For example, solvents or a plasma-etching can be applied.

As already initially mentioned, the at least one environment of the metal structure can have a greater cross section than the at least one location. For this case, the galvanic starting layer remaining on the substrate, with regard to its cross-sectional area per metal structure, is larger than the metal structure arranged on this.

In a variant, the at least one environment has a smaller cross section than the at least one location. In this case, the cross-sectional area of the galvanic starting layer below the metal structure is smaller than the cross section of the metal structure. However, in both cases, a galvanic separation between different metal structures is effected by the removal of the auxiliary layer, by way of the galvanic starting layer which initially still connects the different metal structures, being removed.

In a variant, the substrate for example is a CMOS wafer, In particular, semiconductor wafers can also be applied as a substrate in the method.

An electronic component which is manufactured by way of the method described here, comprises a substrate with at least one metal structure for the electrical connection of components, wherein the at least one metal structure is connected to the substrate by way of a galvanic layer. Herein, the galvanic starting layer comprises traces of breakage or blasting-away, such as tears or unetched burrs, at its edges lying in the region of the metal structure. It is by way of these traces that it can be recognized for example that no etching process was applied. Hence, a remainder of the galvanic starting layer typically has no traces of etching at its edges in several embodiments. Further, in several embodiments the remainder of the galvanic starting layer bends upward toward its edges. The edges are usually not in direct contact with the substrate.

Herein, the metal structure in cross section can be larger than the galvanic starting layer which is connected directly to the substrate. Alternatively, the galvanic starting layer connected to the substrate can have a greater cross-sectional area than the metal structure arranged thereon.

BRIEF DESCRIPTION OF DRAWINGS

The method and the substrate according to this application are hereinafter explained in more detail by way of a few embodiment examples. There are shown in.

DETAILED DESCRIPTION

Figure 1:
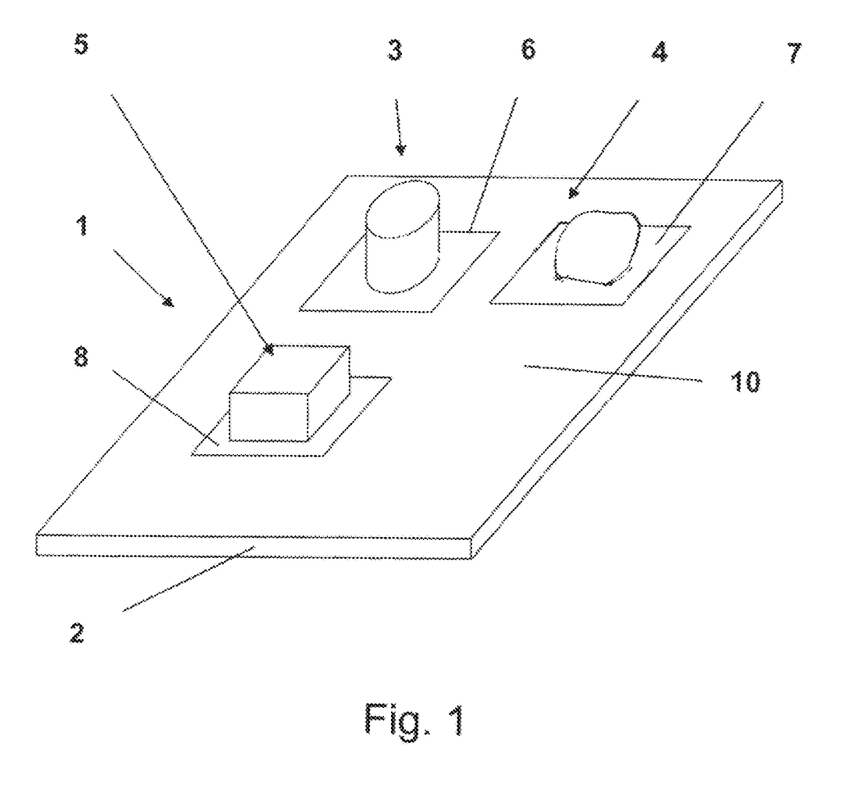
FIG. 1 the schematic view of a substrate with galvanic starting layers and metal structures.
Figure 2:
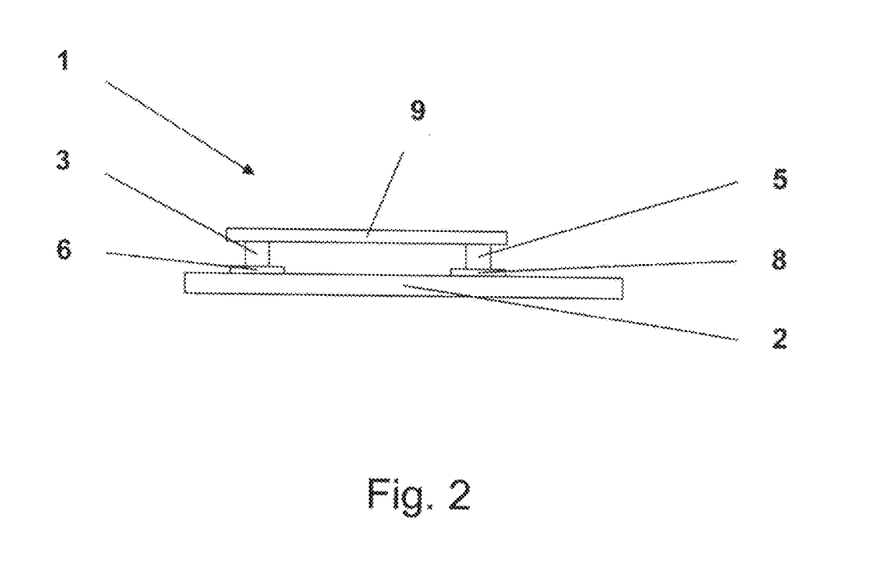
FIG. 2 a cross section through a substrate according to FIG. 1, with an electronic component arranged on two metal structures.

FIG. 1 shows an electronic component 1 with a substrate 2, wherein the substrate is a CMOS wafer. Several metal structures 3, 4 and 5 are arranged on the substrate. The metal structures 3, 4 and 5 (with a height for example of approx. 6 µm) are herein connected to the substrate 2 via an already structured galvanic starting layer 6, 7 and 8. The galvanic starting layer herein only has a low thickness for example of 100 nm (or for example in the region between 50 nm and 300 nm) The galvanic starting layers 6, 7 and 8 are distanced to one another and hence do not conductively connect the metal structures 3, 4 and 5. An electronic component 9 is connected to the metal structures 3 and 5, such that the electronic component 9, for example non-housed chip, is connected to the structures of the substrate, in order to permit a conductive connection between the metals structures, as is represented for example in FIG. 2. The metal structures 3, 4 and 5 which are represented here have different shapes. The metal structure 3 is designed for example in a cylinder-shaped manner. The metal structure 4 is designed as a solder ball whereas the metal structure 5 is cuboid. The metal structures have a cross-sectional area of between 50 µm² to 400 µm² in the plane of the substrate surface.

The metal structures can comprise for example a tin-silver solder which has been connected to the substrate by way of galvanic deposition. Moreover, an under-bump metallization can be arranged below the tin-silver solder another suitable solder), wherein this under-bump metallization for example is of nickel and permits a permanent connection of the metal structure to the galvanic starting layer which can consist for example of titanium-tungsten or copper. Alternatively or additionally to the materials mentioned above, the metal structure can comprise copper (Cu).

According to one approach, an extensive galvanic starting layer is firstly deposited onto the substrate 2, on the surface 10 of the substrate 2. A lithography mask, such as for example a photoresist is subsequently deposited, and this is exposed at several locations and into which the metal structures are subsequently galvanically deposited. The photoresist is subsequently removed, and the regions of the galvanic starting layer which are not required for the contact of the metal structures with substrate are etched. A detachment of the metal structures which is to say an insecure adhesion of the metal structures to the substrate can occur in the case of small dimensions of the metal structures, which have a diameter for example of less than 30 µm, preferably less than 20 µm or less than 10 µm, particularly preferably less than 8 µm or 6 µm. The lower limit is 0.01 µm or 0.1 µm or 1 µm in some embodiment examples.

Figure 3A:
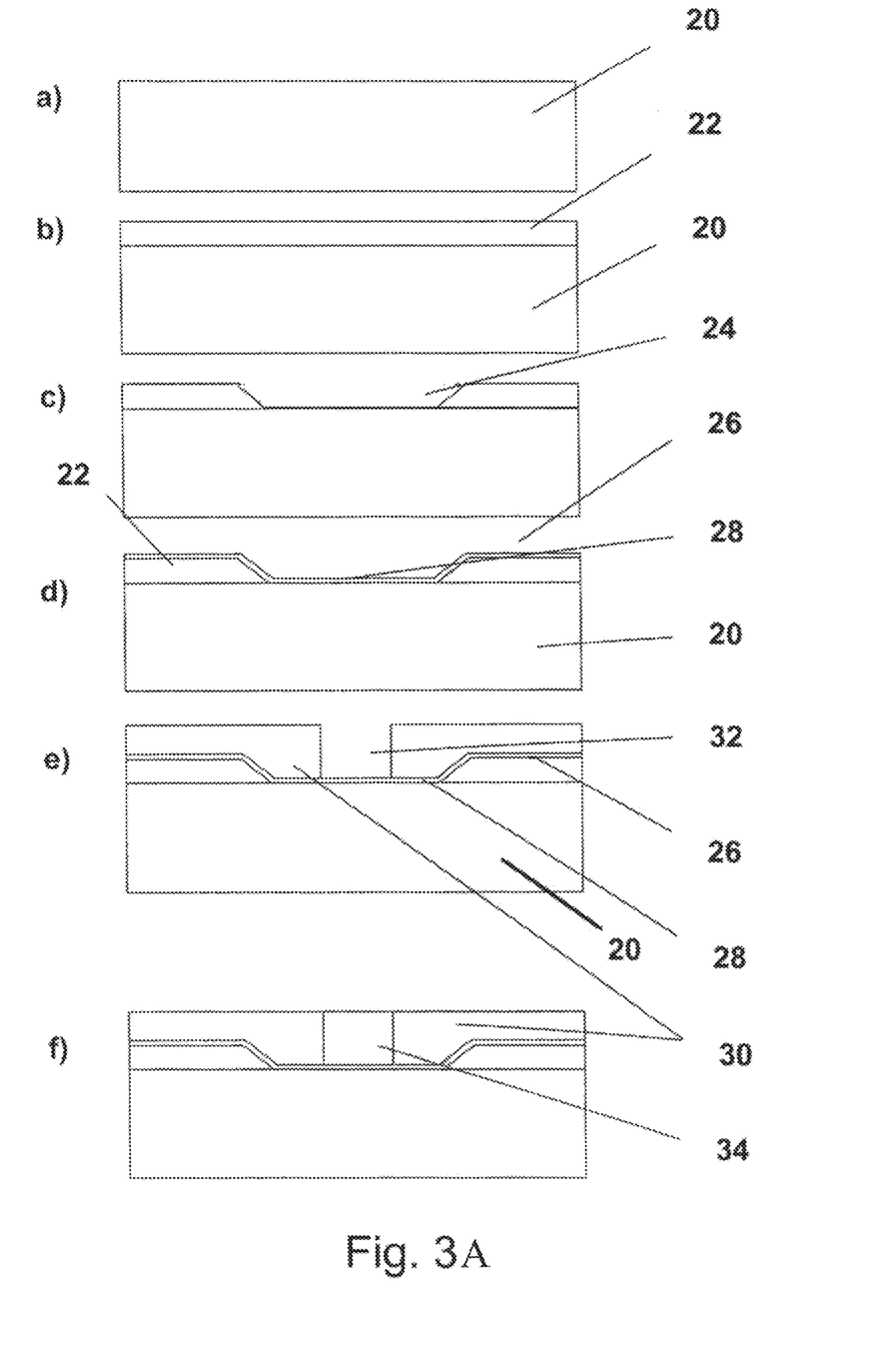
FIGS. 3A-B an illustration of the result of different method steps according to this application.
Figure 3B:
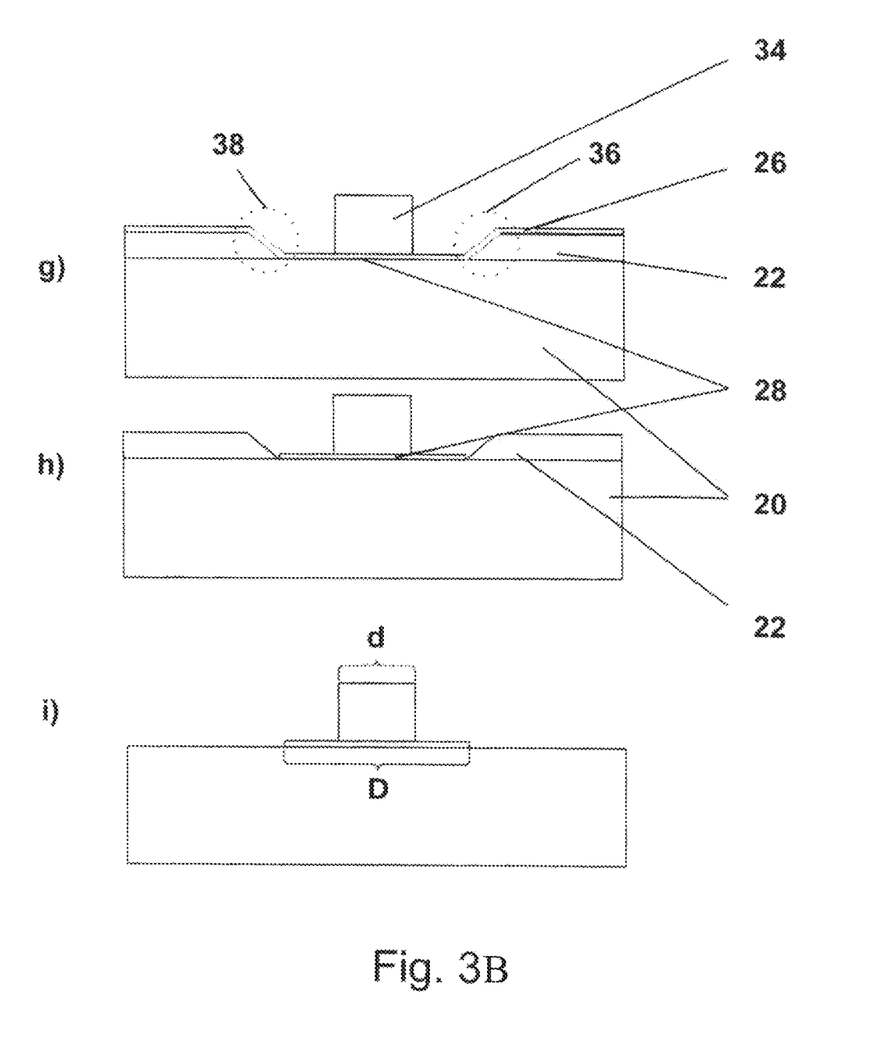
Figure 4:
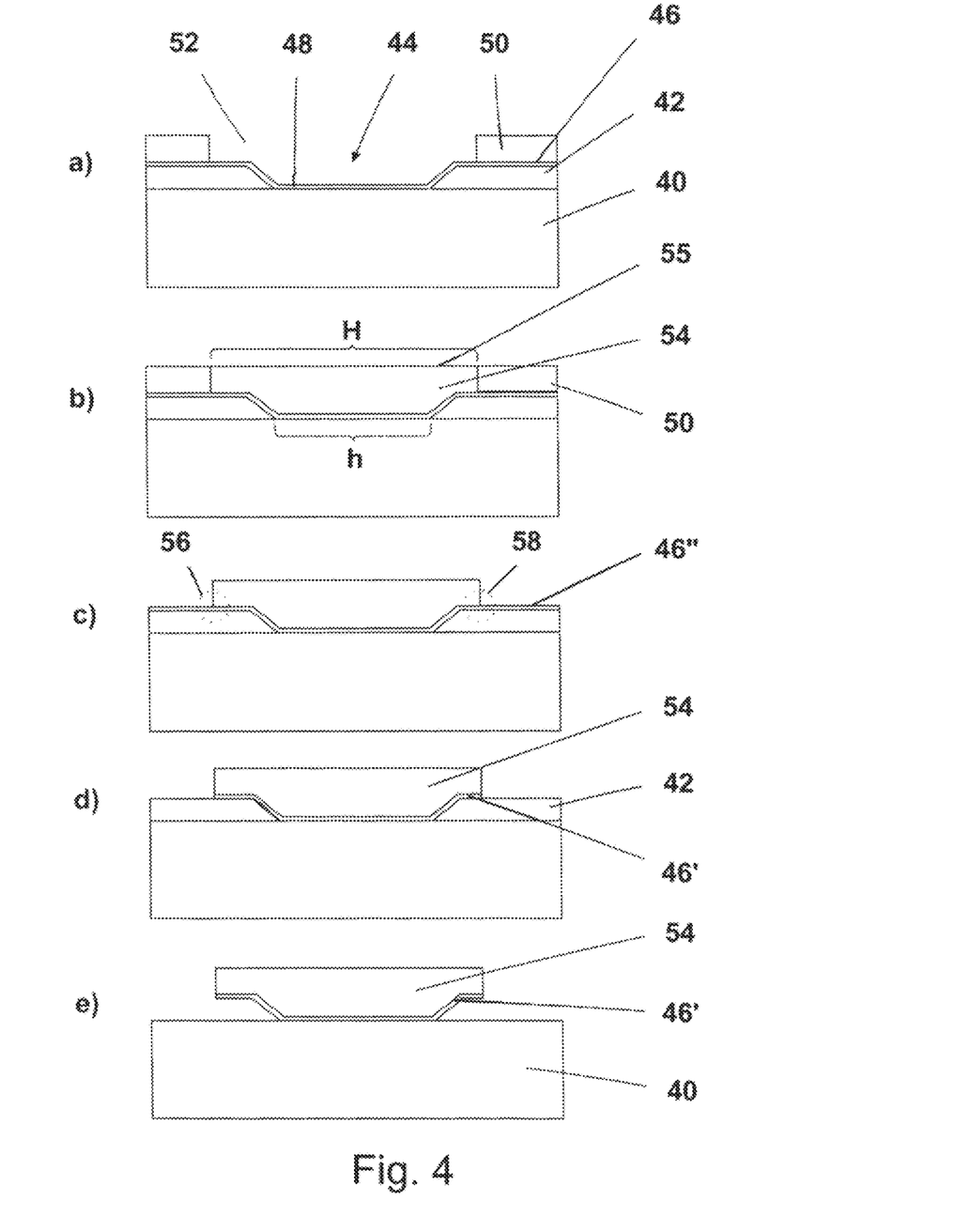
FIG. 4 an embodiment of an alternative method and the different intermediate products which this entails.

According to the method of this application, which is to be explained by way of FIGS. 3A-3B and 4, a secure connection of the metal structures to the substrate can be ensured.

In FIGS. 3A-3B and 4, the substrates are represented in each case in cross section, and it is merely the production of the individual metal structure which is explained. However, to the person skilled in the art, it is evident that the subsequently explained method can also be applied for producing a multitude of metal structures.

Firstly, an auxiliary layer 22 is deposited on the substrate layer 20 represented in FIG. 3A. The substrate itself can comprise for example a structured CMOS wafer or another structured electronic component. This in turn can be constructed of a multitude of structured layers. The auxiliary layer mentioned here is deposited onto a surface of the substrate and subsequently structured. The auxiliary layer can herein be sputtered on and have a thickness for example of less than 1 µm (or a value between 50 nm and 20 µm). In each case plastics such as for example epoxy resins, polyimides or polybenzoaxoles can be applied as materials for the auxiliary layer in each case. Water-soluble plastics such as polyvinyl alcohol can also be applied. The material of the auxiliary layer is not restricted to a certain material class of the plastics or of the above-mentioned examples. The auxiliary layer or the material of the auxiliary layer merely needs to be selected in a manner such that it can be removed again at the end of the process, without having to fall back on wet-chemical etching methods, inasmuch as the etching method are not selective to the galvanic starting layer, e.g. not only etch this.

The auxiliary layer is subsequently removed again in predefined environments, such as for example the represented environment 24. The environment 24 herein defines the surface 28, within which a galvanic starting layer represented in FIG. 3A comes into direct contact with the substrate 20. The structuring of the auxiliary layer can be carried out by way of laser ablation, photolithography or plasma processing, depending on the selected material of this layer. Herein, a further auxiliary masking can be, but does not need to be applied. The subsequently deposited galvanic starting layer 26 is directly connected to the substrate 20, in the region 28 which corresponds essentially to the environment 24. In the regions lying outside the surface 28, the galvanic starting layer 26 is not directly connected to the substrate but merely to the auxiliary layer 22. As is illustrated in FIG. 3A (at part e), a photoresist layer 30 is deposited onto the galvanic starting layer 26, and the photoresist is structured, for example by way of irradiation with light, at a location 32 which lies completed within the surface 28. The location 32 herein defines the location at which the metal structuring to be deposited is arranged on the substrate 20. The metal structure is deposited in the region of the location 32, after the structuring of the photoresist layer 30, with which structuring the locations 32 are incorporated. Herein, an under-bump metallization can firstly be applied, for the improved adhesion of the solder on the galvanic starting layer (or for avoiding diffusion when soldering), and not until afterwards is the solder galvanically deposited. However, with a suitable material selection of the galvanic starting layer and of the solder, a direct deposition of the metal structure onto the galvanic starting layer is possible without an under-bump metallization.

The metal structure 34 which has been deposited at the location 32 by way of a galvanic deposition process is represented in FIG. 3f The photoresist layer 30 is subsequently removed by way of known techniques. This intermediate condition is captured for example in FIG. 3B (at part g). It can be clearly recognized that the metal structure 34 lies completely within the region of the surface 28, e.g. in the region, in which the galvanic starting layer 26 is directly connected to the substrate 20.

The surface of the substrate is subsequently irradiated for example by way of scanning or a surfaced exposure to laser light. The wavelength of the laser light can lie in the ultraviolet region, depending on the applied auxiliary layer. For this, wavelengths such as for example 248 nm, 308 nm or 355 nm which are typically applied for machining structures are preferably used for this. The energy flux density of the applied laser light can for example lie in the region between 10 and 1000 $mJ/cm^2$, but can also lies above or below this, depending on the application. In some embodiment examples, the pulse duration of the laser light lies in the nanosecond region, but can also be selected shorter. A higher input of heat is led into the auxiliary layer on account of the irradiation of the electronic component which is shown in FIG. 3B (at part g), so that this auxiliary layer expands in a shock-like manner. The galvanic starting layer which is arranged on the surface of the auxiliary layer is blasted away in the course of this shock-like expansion. This means that on account of the expansion of the auxiliary layer, the galvanic starting layer which is arranged on the auxiliary layer detaches from the galvanic starting layer arranged directly on the substrate. This means that traces of a "tearing-away" or "blasting-away" at the edges of the galvanic starting layer, in the regions 36 and 38, are witness to the fact that the galvanic starting layer has not been etched at a later stage, but was mechanically or physically blasted away. However, due to the blasting-away procedure, a galvanic starting layer only remains in the surfaces 28, so that the arrangement of the metal structures 3, 4 and 5 with the galvanic starting layer structures 6, 7 and 8 lying therebelow and represented in for example in FIG. 1 remains. The individual metal structures are galvanically separated from one another on account of this. The result of the blasting-away is represented in FIG. 3B (at part h). Since the auxiliary layer merely expanded, but continued to remain connected to the substrate, auxiliary layer elements are still present on the substrate 20. Depending on the applied material, these auxiliary layer elements can be removed from the substrate surface by way of a cleaning process. The cleaning process is carried out for example with deionized water, inasmuch as it is the case for example of a water-soluble plastic. However, with other applied materials of the auxiliary layer, suitable other cleaning process can also be applied. The result is represented in FIG. 3B (at part i). In the example of a process course which is represented in FIGS. 3A-3B, a galvanic starting layer having a diameter D remains, on which layer a metal structure with a diameter d is arranged. Herein, in the present example, the diameter D is larger than the diameter d.

An alternative embodiment of the method is explained by way of FIG. 4 (at parts a to e) Herein, the method steps which have been illustrated by way of FIG. 3A (parts a to d) are no longer specified.

A substrate 40 with a structured auxiliary layer 42 which is arranged thereon is represented in FIG. 4 (at part a), wherein the auxiliary layer has been removed in a region 44, so that a galvanic starting layer 46 in parts is directly connected to the substrate (see surface 48) and is arranged on the auxiliary layer 42 outside these surfaces 48. A photoresist 50 is subsequently deposited onto the galvanic starting layer over the complete surface, and is subsequently structured. In contrast to the embodiment example of FIGS. 3A-3B, the location 52 which has been exposed by way of the photolithographic structuring of the photoresist layer, with regard to its diameter is larger than the surface 48 lying therebelow. The result is this is that the subsequently deposited metal structure 54 at its upper surface 55 has a larger diameter H than at its lower fastening surface 48 which merely has a diameter h. The photoresist layer 50 is subsequently removed, so that the condition represented in FIG. 4 (at part c) is created. The substrate is now irradiated with laser light, so that a shock-like expansion of the auxiliary layer occurs, and the regions of the galvanic starting layer which lie outside the diameter H are blasted away from the auxiliary layer. Tear marks in the galvanic starting layer occur in the regions 56 and 58 due to this, and these marks are witness to the mechanical blasting-away and qualitatively differ from chemical etching marks. Typically, the galvanic starting layer bends upwards towards an edge comprising the regions 56 and 58. The edge of the galvanic starting layer is typically not in direct contact with the substrate.

Figure 5:
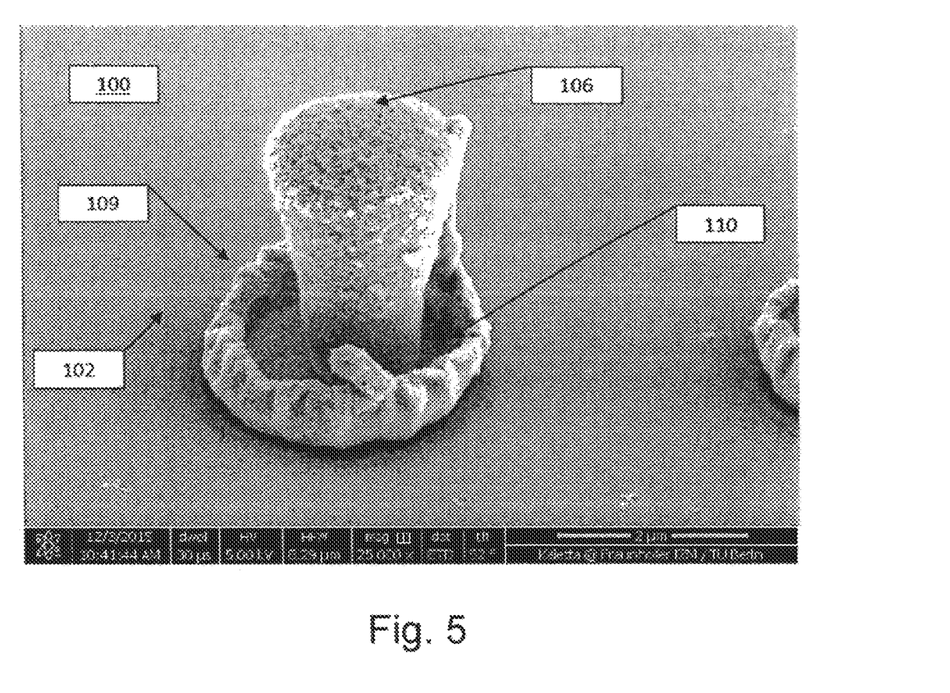
FIG. 5 an electron microscope photo of a detail of an electronic component with an individual metal structure, and, lying below this, the galvanic starting layer and substrate surface.

FIG. 5 shows an electron-microscopic image of an electronic component which is manufactured by way of the method suggested here. What is to be seen is a substrate 100 with a substrate surface 102, on which a structured galvanic starting layer 110 is deposited. A conically shaped solder bump 106 is arranged on the galvanic starting layer 110. The sizes of the individual elements are to be deduced from the scale represented in FIG. 5.

The galvanic starting layer was firstly deposited over the whole surface, onto a structured auxiliary layer deposited on the substrate surface (cf. with FIGS. 3A-3B, or 4), and was removed after the completion of the metal structure, by way of the auxiliary layer having been excited into rapid expansion by way of laser irradiation. The galvanic starting layer was removed outside the environments (e.g. essentially the standing surface of the remaining galvanic starting layer), with the rapid expansion of the auxiliary layer. This physical removal can be recognized on the remaining galvanic starting layer 110 by way of the edge 109 of the galvanic starting layer being bent up. The edge moreover runs in a waved manner. These traces are seen as breakage traces and qualitatively differ from etching traces which would not lead to a bending-up of the remaining galvanic starting layer 110. Due to the bending of the edge, the edge is not in direct contact with the substrate.

In other embodiments, the edge 110 is not bent up, but is flat, but can however still be differentiated from an etched edge.

It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled.

The invention claimed is:
1. A method for manufacturing metal structures for the electrical connection of components, wherein the method comprises the following steps:
 a) depositing an auxiliary layer on a substrate;
 b) structuring the auxiliary layer in a manner such that the substrate is exposed at at least one environment which is envisaged for the metal structures;
 c) depositing a galvanic starting layer on the structured auxiliary layer;
 d) depositing a lithography layer on the galvanic starting layer and structuring the lithography layer in a manner such that the galvanic starting layer is exposed at at least one location envisaged for the metal structure;
 e) galvanically depositing at least one metal structure at the at least one exposed location;

f) irradiating the substrate with light, after the galvanic depositing of the at least one metal structure, wherein the intensity and the wavelength of the light is selected in a manner such that the structured auxiliary layer expands; and g) removing the structured auxiliary layer.

2. The method according to claim 1, wherein the lithography layer is removed before the irradiation with light.

3. The method according to claim 1, wherein a multitude of environments and locations are exposed, as well as a multitude of metal structures deposited.

4. The method according to claim 1, wherein the at least one metal structure is a solder deposit.

5. The method according to claim 1, wherein the at least one metal structure has a cross-sectional area of less than 400 $\mu m^2$.

6. The method according to claim 1, wherein the auxiliary layer is removed by way of a cleaning process.

7. The method according to claim 1, wherein the auxiliary layer is a water-soluble or water-insoluble plastic layer.

8. The method according to claim 1, wherein the at least one environment has a smaller cross section than the at least one location.

9. The method according to claim 1, wherein the at least one environment has a larger cross section than the at least one location.

10. The method according to claim 1, wherein the substrate is a CMOS wafer.

11. The method according to claim 1, comprising providing: an electronic component with a substrate and with at least one metal structure for the electrical connection of components, wherein the at least one metal structure is connected to the substrate by way of a galvanic layer, wherein the galvanic starting layer has breakage traces at its edges.

12. The method according to claim 1, comprising providing: an electronic component with a substrate and with at least one metal structure for the electrical connection of components, wherein the at least one metal structure is connected to the substrate by way of a galvanic layer, wherein the galvanic starting layer has no traces of etching at its edges.

13. An electronic component, manufactured according to the method according to claim 1.

* * * * *